March 28, 1961 A. J. CORNISH 2,977,400
THERMOELEMENTS AND DEVICES EMBODYING THEM
Filed Sept. 15, 1959
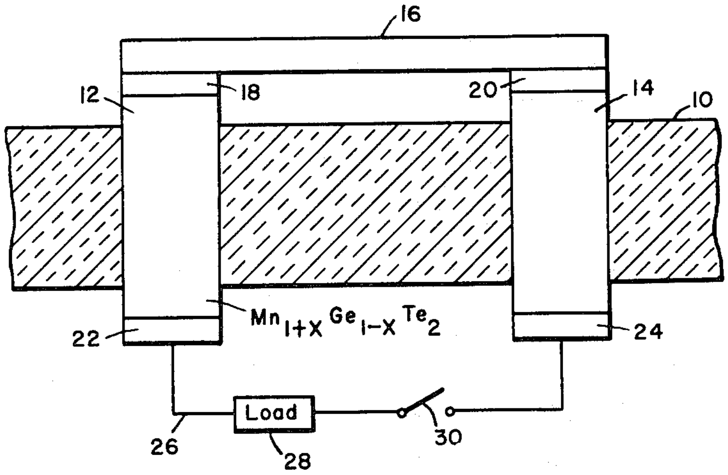
WITNESSES
Wm. B. Sellers.
Charles L. Menzemer
INVENTOR
Albert J. Cornish
BY
Frederick Shapoe
ATTORNEY United States Patent Office 2,977,400
Patented Mar. 28, 1961

2,977,400

THERMOELEMENTS AND DEVICES EMBODYING THEM

Albert J. Cornish, Pittsburgh, Pa., assignor to Westinghouse Electric Corporation, East Pittsburgh, Pa., a corporation of Pennsylvania Filed Sept. 15, 1959, Ser. No. 840,085

4 Claims. (Cl. 136—5)

The present invention relates generally to thermoelements and particularly to thermoelements comprised of manganese-germanium-telluride and thermoelectric devices embodying the same.

It has been regarded as highly desirable to produce thermoelectric devices wherein either an electric current is passed therethrough to effect cooling at one junction whereby to provide for cooling applications, or alternatively, a source of heat is applied to one junction of a thermoelectric device to bring this junction to a given elevated temperature, while the other junction of the device is kept at a low temperature, whereby an electrical voltage is generated in the device. For refrigeration or cooling applications in particular, one junction of the thermoelectric device is disposed within an insulated chamber and an electrical current is passed through the junction in such a direction that the junction within the chamber becomes cooler while the other junction of the thermoelectric device is disposed externally of the chamber and dissipates heat to a suitable heat sink such as the atmosphere, cooling water or the like.

When heat is applied to one junction of a thermoelectric device while the other junction is cooled, an electrical potential is produced proportional to the thermoelectric power of the thermoelements employed, and to the temperature difference between the junctions. Accordingly, it is desirable that the thermoelements be made of such material that, all other factors being equal, the highest potential is developed for a given temperature difference between the hot and cold junctions. The electrical resistivity of the thermoelement member of the device and the thermal conductivity both should be as low as possible in order to reduce electrical losses and thermal losses.

Thermoelectric devices may be tested and a number indicating its relative effectiveness, called the index of efficiency, may be computed from the test data. The higher the index of efficiency the more efficient is the thermoelectric material. The index of efficiency, denoted as Z, is defined by:

$$Z=\frac{\alpha^2}{pK}$$

wherein:

$\alpha$=Seebeck coefficient in volts/° K.
$p$=electrical resistivity in ohm-cm.
$K$=thermal conductivity in watts/cm.° K.

An object of the present invention is to provide a thermoelectric material having the formula $$Mn_{1+x}Ge_{1-x}Te_2$$

wherein $x$ has a value varying from 0 to $\pm$ 0.1.

Another object of the present invention is to provide a thermoelectric device comprising a thermoelement having the formula $Mn_{1+x}Ge_{1-x}Te_2$ wherein $x$ varies from 0 to $\pm$ 0.1.

Other objects will, in part, appear hereinafter and will, in part, be obvious.

For a better understanding of the nature and objects of the invention, reference should be had to the following detailed description and drawing, the single figure of which is a side view partially in cross-section, of a thermoelectric generator.

In accordance with the present invention and attainment of the foregoing objects, there is provided a thermoelectric power generating device having a high efficiency, when the hot junction is heated to a temperature within the range of from about 400° C. to 900° C., comprising a thermoelectric pair of which the first thermoelement member comprises crystalline, manganese-germanium-telluride and the second thermoelement member comprises a thermoelement material of opposite sign electrically connected to one portion of said first member.

The thermoelectric material of this invention having the formula $Mn_{1+x}Ge_{1-x}Te_2$ has a simple cubic NaCl structure with a room temperature lattice distance of about 5.885 A. In polycrystalline form it has a melting point of approximately 1005° C.

The thermoelement of opposite sign which may be used in combination with the material of this invention may be comprised of a metal, for example, copper, silver and mixtures and alloys thereof and negative thermoelectric materials, for example, indium arsenide, aluminum arsenide, antimony telluride, and mixtures thereof. Since a thermoelement comprising manganese-germanium-telluride is most efficient at a temperature in the range of approximately 400° C. to 900° C., it will be appreciated that the negative thermoelement material also must function well and be chemically and thermally stable within this temperature range.

One preferred method of preparing single crystal manganese-germanium-telluride suitable for use in accordance with the teachings of this invention comprises admixing stoichiometric proportions of finely divided manganese (Mn), germanium (Ge) and tellurium (Te) to form the compound manganese-germanium-telluride ($MnGeTe_2$) and charging the mixture into a vessel of quartz or other inert material that will not react with a melt of the material. The vessel is then evacuated and sealed off under a vacuum of approximately $10^{-4}$ mm. Hg. The vessel is placed in a horizontal tube furnace and heated to a temperature in excess of 1020° C., preferably a temperature of approximately 1050° C., at which temperature the entire mixture becomes molten. The vessel is agitated to insure complete mixing during the melting period, and then allowed to cool to room temperature.

In preparing single crystal solidified manganese-germanium-telluride, the vessel is then suspended in the top zone of a vertical tube furnace having two heating zones. The top zone of the heating furnace is maintained at a temperature of at least 1020° C. preferably about 1050° C. The bottom zone of the furnace is maintained at a temperature below 990° C., preferably approximately 950° C. The vessel is slowly lowered to the top zone of the furnace to the bottom zone. Satisfactory results have been achieved when using the furnace having a top hot zone of 12 inches in length and a cooler bottom zone of 12 inches in length when the vessel is lowered at the rate of approximately 2 inches per hour. After the vessel reaches the center of the bottom zone of the furnace, it is allowed to remain at a temperature of approximately 950° C. for several hours and then allowed to cool to room temperature. Other single crystal techniques may be employed.

To prepare polycrystalline material, the manganese, germanium and tellurium, in predetermined amounts, are melted together at a temperature of approximately 1050° C., agitated to insure a homogeneous mixture, and then cooled to room temperature. The cooling may be slow as by passing from a vertical furnace chamber at from 0.25 inch to 2 inches per hour, or the cooling may be done quickly as by quenching.

For thermoelectric purposes the manganese-germanium-telluride should be a crystalline body free from voids. The material may be either polycrystalline or single crystal material.

The following examples illustrate the practice of this invention:

*Example I*

While the manganese-germanium-telluride of this invention may be prepared by any of several methods known in the art, it has been found that the following method is particularly satisfactory. An intimate homogeneous mixture comprising 7.260 grams of germanium, 25.522 grams of tellurium, and 5.493 grams of manganese, all finely powdered was charged into a quartz bulb having an inside diameter of ⅝ inch. The bulb was evacuated and sealed off under a vacuum of $10^{-4}$ mm. Hg. The bulb was then placed in a furnace and heated to 1050° C. at which temperature the mixture became molten. The bulb was agitated to insure thorough mixing during the heating step, and then allowed to cool to room temperature—approximately 25° C. The bulb was then suspended in the top zone of a vertical tube furnace having two heating zones. The top zone of the furnace was 12 inches long and the bottom heating zone was 12 inches long. The bulb was suspended at approximately the midpoint of the top heating zone of the furnace which was maintained at a temperature of 1050° C., and the bulb allowed to descend through the top zone at a rate of approximately 2 inches per hour. Upon descending from the top heating zone the bulb entered the lower heating zone which was maintained at a temperature of 950° C. The bulb was allowed to pass through approximately one-half (6 inches) of the lower heating zone and then stopped in its descent and maintained at a temperature of 950° C. for approximately 8 hours. The resultant polycrystalline manganese-germanium-telluride was then allowed to cool to room temperature. It was a single crystal material of p-type semiconductivity and had the formula $MnGeTe_2$.

The homogeneous manganese-germanium-telluride thus formed was cut into test wafers, and tested for its properties and the figure of merit was determined using the equation:

$$Z=\frac{\alpha^2}{pK}$$

wherein: $\alpha$, $p$ and K have the meaning set forth above herein. The figure of merit (Z) of the wafer was found to be approximately $0.35\times10^{-3}$ at a temperature of 500° C.

*Example II*

Polycrystalline manganese-germanium-telluride was prepared by intimately admixing 7.260 grams of germanium, 25.522 grams of tellurium and 5.493 grams of manganese, and charging it into a quartz bulb having an inside diameter of ⅝ inch. The bulb was evacuated and sealed off under a vacuum of $10^{-4}$ mm. Hg. The bulb was then placed in a vertical tube furnace and heated to 1050° C. at which temperature the mixture became molten. The bulb was agitated to insure mixing during the heating step, and then allowed to cool to room temperature (25° C.).

The material thus produced was polycrystalline, had the formula $MnGeTe_2$ and had a p-type semiconductivity.

The material had a figure of merit (Z) of approximately $0.35\times10^{-3}$ at 500° C.

Referring to the figure of the drawing, there is illustrated a thermoelectric device suitable for producing electrical current from heat. A thermally insulating wall 10 so formed as to provide a suitable furnace chamber is perforated to permit the passage therethrough of a positive manganese-germanium-telluride thermoelement 12 and a negative thermoelement member 14 such as indium arsenide. An electrically conducting strip of metal 16, for example, copper, silver or the like, is joined to an end face 18 of the member 12 and end face 20 of the member 14 within the chamber so as to provide good electrical and thermal contact therewith. The end faces 18 and 20 may be coated with a thin layer of metal, for example, by vacuum evaporation or by use of ultrasonic brazing whereby good electrical contact is obtained. The metal strip 16 of copper, silver or the like may be brazed or soldered to the metal coated faces 18 and 20. The metal strip 16 may be provided with suitable fins or other means for conducting heat thereto from the furnace chamber in which it is disposed.

At the end of the member 12 located on the other side of the wall 10 is attached a metal plate or strip 22 by brazing or soldering in the same manner as was employed in attaching strip 16 to the end face 18. Similarly, a metal strip or plate 24 may be connected to the other end of member 14. The plates 22 and 24 may be provided with heat dissipating fins or other cooling means whereby heat conducted thereto may be dissipated. The surface of the plates 22 and 24 may also be cooled by passing a current of a fluid such as water or air across their surfaces. An electrical conductor 26 containing a load 28 is electrically connected to the end plates 22 and 24. A switch 30 is interposed in the conductor 26 to enable the electrical circuit to be opened and closed as desired. When the switch 30 is moved to the closed position an electric current flows between members 12 and 14 and energizes the load 28.

It will be appreciated that a plurality of pairs of the positive and negative members may be joined in series in order to produce a plurality of cooperating thermoelements. In a similar manner each of the thermoelements may be disposed with one junction in a furnace or exposed to any other source of heat while the other junction is cooled by applying water or blowing air thereon or the like. Due to the relative difference in the temperature of the junctions, an electrical voltage will be generated in the thermoelements. By joining in series a plurality of the thermoelements, direct current of any suitable voltage may be generated.

While the element 12 has been shown to be comprised entirely of $Mn_{1+x}Ge_{1-x}Te_2$, it will be understood that the $Mn_{1+x}Ge_{1-x}Te_2$ material may comprise only a portion of the element, the remainder being comprised of one or more materials of the same thermoelectric sign.

It will be appreciated that the above description and drawing is only exemplary and not exhaustive of the invention.

I claim as my invention:

1. A material suitable for use as a p-type thermoelectric material, the material having the formula $$Mn_{1+x}Ge_{1-x}Te_2$$

wherein $x$ has a value of from 0 to ±0.1.

2. A thermoelectric device comprising a first member comprised of crystalline manganese-germanium-telluride having the formula $Mn_{1+x}GE_{1-x}Te_2$ wherein $x$ varies from 0 to ±0.1, and a second member electrically connected to one portion of said first member.

3. A thermoelectric device capable of generating power comprising a first positive thermoelectric element having the formula $Mn_{1+x}Ge_{1-x}Te_2$ wherein $x$ varies from 0 to ±0.1, and a negative thermoelectric element.

4. A thermoelectric device capable of generating power comprising a first member comprised of manganese-germanium-telluride and having the formula $$Mn_{1+x}Ge_{1-x}Te_2$$

wherein $x$ varies from 0 to ±0.1, a second member of a negative thermoelectric material, an electrically conductive member disposed between and metallurgically joined to a first surface of said first member and a first surface of said second member, a heat source transmitting heat to the first surface of said first and said second members, an electrical conductor joining a second surface of said first member and a second surface of said second member, and means for cooling said second surface of said first and second members, whereby an electrical current is generated.

References Cited in the file of this patent

UNITED STATES PATENTS 2,833,969 Christian ---------------- May 6, 1958

OTHER REFERENCES

Chemical Abstracts, page 12, 639(*h*), vol. 51, 1957.